US005495181A

United States Patent [19]
Kolze

[11] Patent Number: 5,495,181
[45] Date of Patent: Feb. 27, 1996

[54] INTEGRATED CIRCUIT FACILITATING SIMULTANEOUS PROGRAMMING OF MULTIPLE ANTIFUSES

[75] Inventor: Paige A. Kolze, San Jose, Calif.

[73] Assignee: QuickLogic Corporation, Santa Clara, Calif.

[21] Appl. No.: 349,093

[22] Filed: Dec. 1, 1994

[51] Int. Cl.[6] .................................................. H03K 19/177
[52] U.S. Cl. ............................... 326/38; 326/44; 327/525; 437/922; 365/96
[58] Field of Search ..................................... 437/170, 172, 437/922; 365/96; 326/38, 44; 327/525

[56] References Cited

U.S. PATENT DOCUMENTS

| | | |
|---|---|---|
| 3,987,287 | 10/1976 | Cox et al. . |
| 4,207,556 | 6/1980 | Sugiyama et al. ................ 340/166 R |
| 4,433,331 | 2/1984 | Kollaritsch ........................ 340/825.83 |
| 4,442,507 | 4/1984 | Roesner .................................. 365/100 |
| 4,455,495 | 6/1984 | Masuhara et al. ....................... 307/44 |
| 4,642,487 | 2/1987 | Carter . |
| 4,670,749 | 6/1987 | Freeman ............................ 340/825.85 |
| 4,698,589 | 10/1987 | Blankenship et al. ............. 324/158 R |
| 4,749,947 | 6/1988 | Gheewala ............................ 324/73 R |
| 4,758,745 | 6/1988 | El Gamal et al. . |
| 4,783,763 | 11/1988 | Bergman .................................. 365/94 |
| 4,786,904 | 11/1988 | Graham, III et al. ............. 340/825.83 |
| 4,857,774 | 8/1989 | El-Ayat et al. . |
| 4,870,302 | 9/1989 | Freeman . |
| 4,873,459 | 10/1989 | El Gamal et al. . |
| 4,899,205 | 2/1990 | Hamdy et al. ............................ 357/51 |

(List continued on next page.)

FOREIGN PATENT DOCUMENTS

416903A2  3/1991  European Pat. Off. ............... 21/3205

OTHER PUBLICATIONS

El Gamal et al., "An Architecture for Electrically Configurable Gate Arrays", IEEE Journal of Solid–State Circuits, vol. 24, No. 2, Apr. 1989, pp. 394–398.

El–Ayat et al., "A CMOS Electrically Configurable Gate Array", IEEE International Solid–State Circuits Conference, 1988, Digest of Technical Papers, pp. 76–77.

An Introduction To Quicklogic's pASIC Devices and SpDE Development Environment, QuickLogic Corporation, Apr. 1991, pp. 1–12.

Birkner et al., "A Very High–Speed Field Programmable Gate Array Using Metal–To–Metal Antifuse Programmable Elements", paper presented at IEEE 1991 Custom Integrated Circuits Conference, Session 1, May 12, 1991, 7 pgs.

"Very High Speed Programmable ASIC Devices and Development Tools", QuickLogic Corporation, *pASIC Toolkit User's Guide*, Jun. 1991, 191 pgs.

Raffel et al., "A Wafer–Scale Digital Integrator Using Restructurable VSLI", IEEE Journal of Solid–State Circuits, vol. SC–20, No. 1, Feb. 1985, pp. 399–406.

(List continued on next page.)

*Primary Examiner*—Edward P. Westin
*Assistant Examiner*—Benjamin D. Driscoll
*Attorney, Agent, or Firm*—Skjerven, Morrill, MacPherson, Franklin & Friel; T. Lester Wallace

[57] ABSTRACT

To facilitate the simultaneous programming of multiple antifuses on an integrated circuit, a first current path is established from a first programming terminal (VPP1) of a programmable logic device through a first antifuse to be programmed and a second current path is established from a second programming terminal (VPP2) of the programmable logic device through a second antifuse to be programmed. By supplying the programming current for programming the first antifuse from a different terminal than the programming current for programming the second antifuse, the two antifuses can be programmed simultaneously with an adequate amount of programming current being supplied to each antifuse. A programming current multiplexer circuit is disclosed for selectively coupling either a first programming voltage (VPP1) terminal, a second programming voltage (VPP2), or a ground terminal (GND) to a programming bus and/or to an antifuse to be programmed. The first and second current paths can be established using multiple such programming current multiplexer circuits.

22 Claims, 17 Drawing Sheets

U.S. PATENT DOCUMENTS

| | | | |
|---|---|---|---|
| 4,910,417 | 3/1990 | El Gamal et al. . | |
| 4,910,418 | 3/1990 | Graham et al. . | |
| 4,924,287 | 5/1990 | Orbach | 357/51 |
| 4,933,898 | 6/1990 | Gilberg et al. | 365/53 |
| 4,945,267 | 7/1990 | Galbraith . | |
| 4,949,084 | 8/1990 | Schwartz et al. | 340/825.83 |
| 4,963,770 | 10/1990 | Keida . | |
| 4,969,124 | 11/1990 | Luich et al. | 365/201 |
| 4,972,105 | 11/1990 | Burton et al. . | |
| 5,003,200 | 3/1991 | Sakamoto . | |
| 5,008,855 | 4/1991 | Eltoukhy et al. | 365/96 |
| 5,015,885 | 5/1991 | El Gamal et al. . | |
| 5,049,969 | 9/1991 | Orbach et al. | 357/51 |
| 5,055,718 | 10/1991 | Galbraith et al. . | |
| 5,070,384 | 12/1991 | McCollum et al. | 357/51 |
| 5,073,729 | 12/1991 | Greene et al. . | |
| 5,083,083 | 1/1992 | El-Ayat et al. | 324/158 R |
| 5,095,228 | 3/1992 | Galbraith et al. . | |
| 5,099,149 | 3/1992 | Smith . | |
| 5,126,282 | 6/1992 | Chiang et al. | 437/172 |
| 5,130,777 | 7/1992 | Galbraith et al. | 357/51 |
| 5,132,571 | 7/1992 | McCollum et al. . | |
| 5,134,457 | 7/1992 | Hamdy et al. | 357/51 |
| 5,140,554 | 8/1992 | Schreck et al. | 365/201 |
| 5,166,556 | 11/1992 | Hsu et al. . | |
| 5,172,014 | 12/1992 | El-Ayat et al. . | |
| 5,187,393 | 2/1993 | El Gamal et al. . | |
| 5,191,241 | 3/1993 | McCollum et al. . | |
| 5,194,759 | 3/1993 | El-Ayat et al. . | |
| 5,196,724 | 3/1993 | Gordon et al. | 257/530 |
| 5,198,705 | 3/1993 | Galbraith et al. | 307/465 |
| 5,200,632 | 4/1993 | Lee . | |
| 5,208,530 | 5/1993 | El-Ayat et al. | 324/158 R |
| 5,220,213 | 6/1993 | Chan et al. . | |
| 5,223,792 | 6/1993 | El-Ayat et al. | 324/158 R |
| 5,243,226 | 9/1993 | Chan . | |
| 5,294,846 | 3/1994 | Paivinen . | |
| 5,302,546 | 4/1994 | Gordon et al. | 437/170 |
| 5,309,091 | 5/1994 | El-Ayat et al. | 324/158 R |
| 5,316,971 | 5/1994 | Chiang et al. | 437/170 |
| 5,317,698 | 5/1994 | Chan | 395/325 |
| 5,327,024 | 7/1994 | Cox . | |
| 5,341,030 | 8/1994 | Galbraith . | |
| 5,341,043 | 8/1994 | McCollum . | |
| 5,341,092 | 8/1994 | El-Ayat et al. | 324/158 R |
| 5,371,414 | 12/1994 | Galbraith | 437/922 |

OTHER PUBLICATIONS

"Very High Speed FPGAs", *QuickLogic Corporation 1994 Data Book,* QuickLogic Corporation, 1994, 72 pgs.

Brown et al., *Field–Programmable Gate Arrays,* Kluwer Academic Publishers, 1992, (Chapters 2 and 5, plus references) total 66 pgs.

Trimberger et al., *Field–Programmable Gate Array Technology,* Kluwer Academic Publishers, 1994, (Chapter 3, plus references) total 45 pgs.

"FPGA Data Book and Design Guide", *Actel Corporation 1994 Data Book,* 75 pgs.

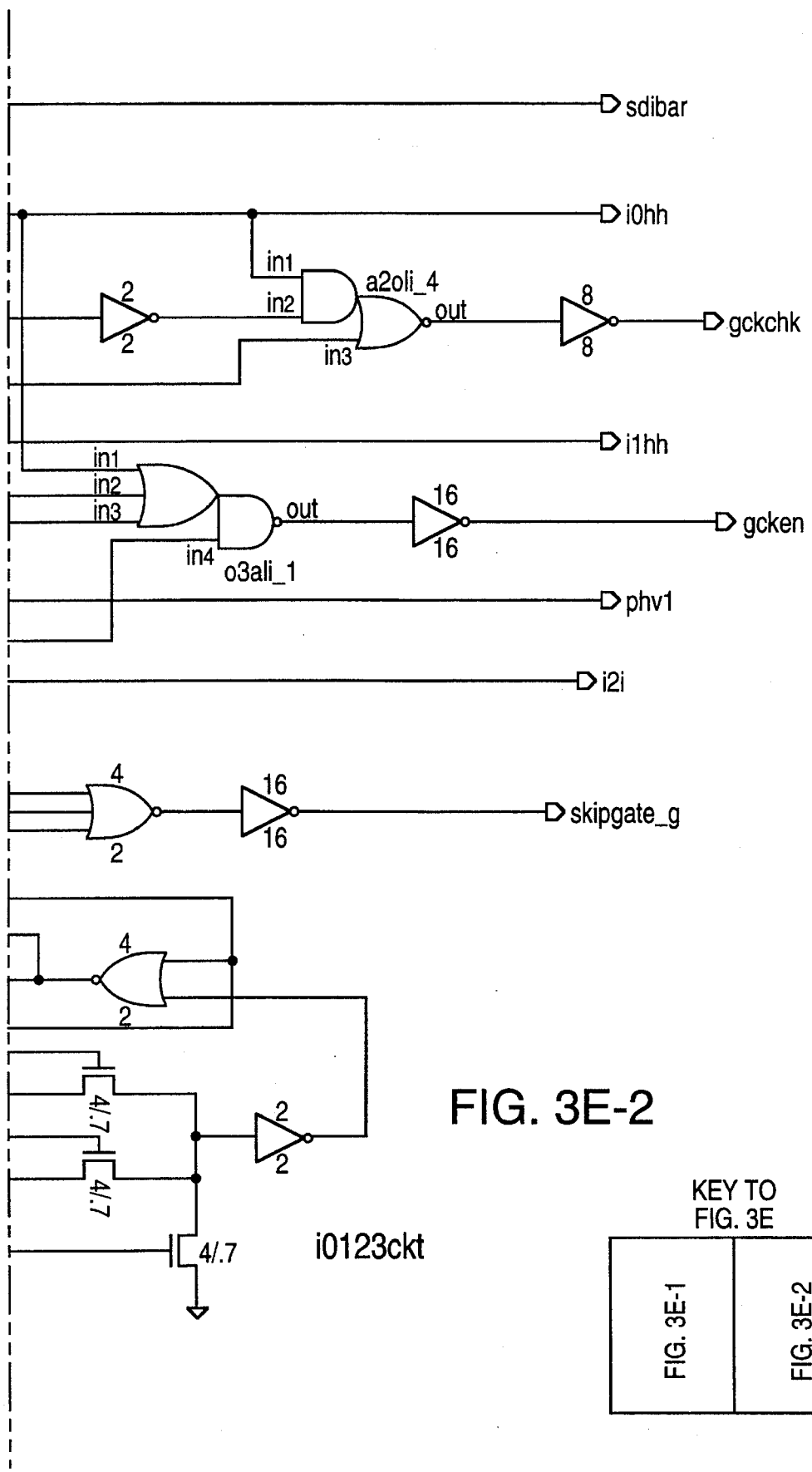
FIG. 3E-2
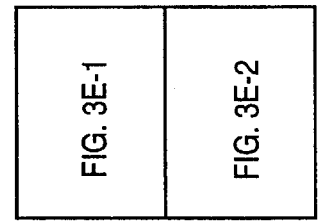
KEY TO FIG. 3E
| FIG. 3E-1 | FIG. 3E-2 |

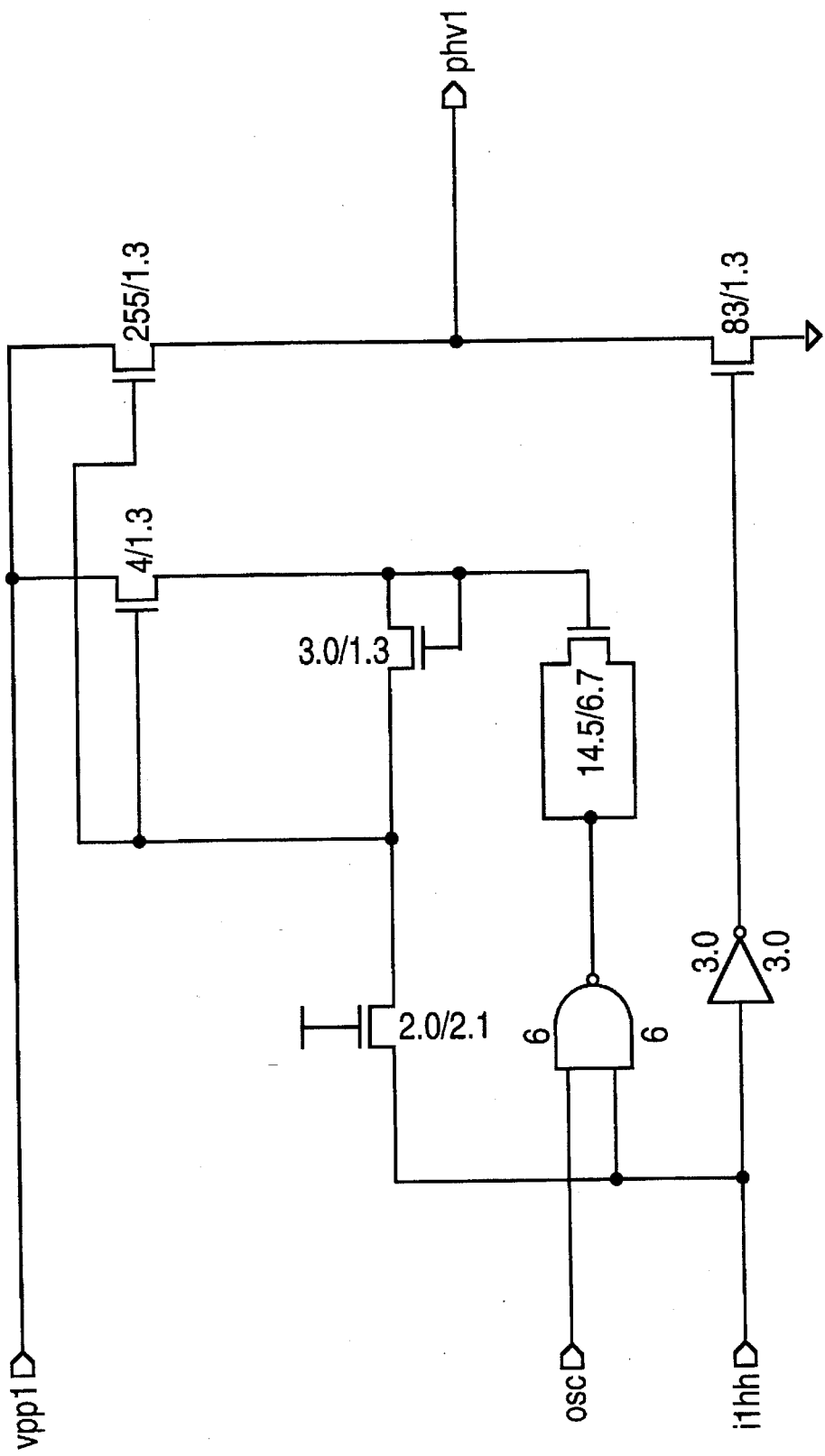
FIG. 3F phv1pump

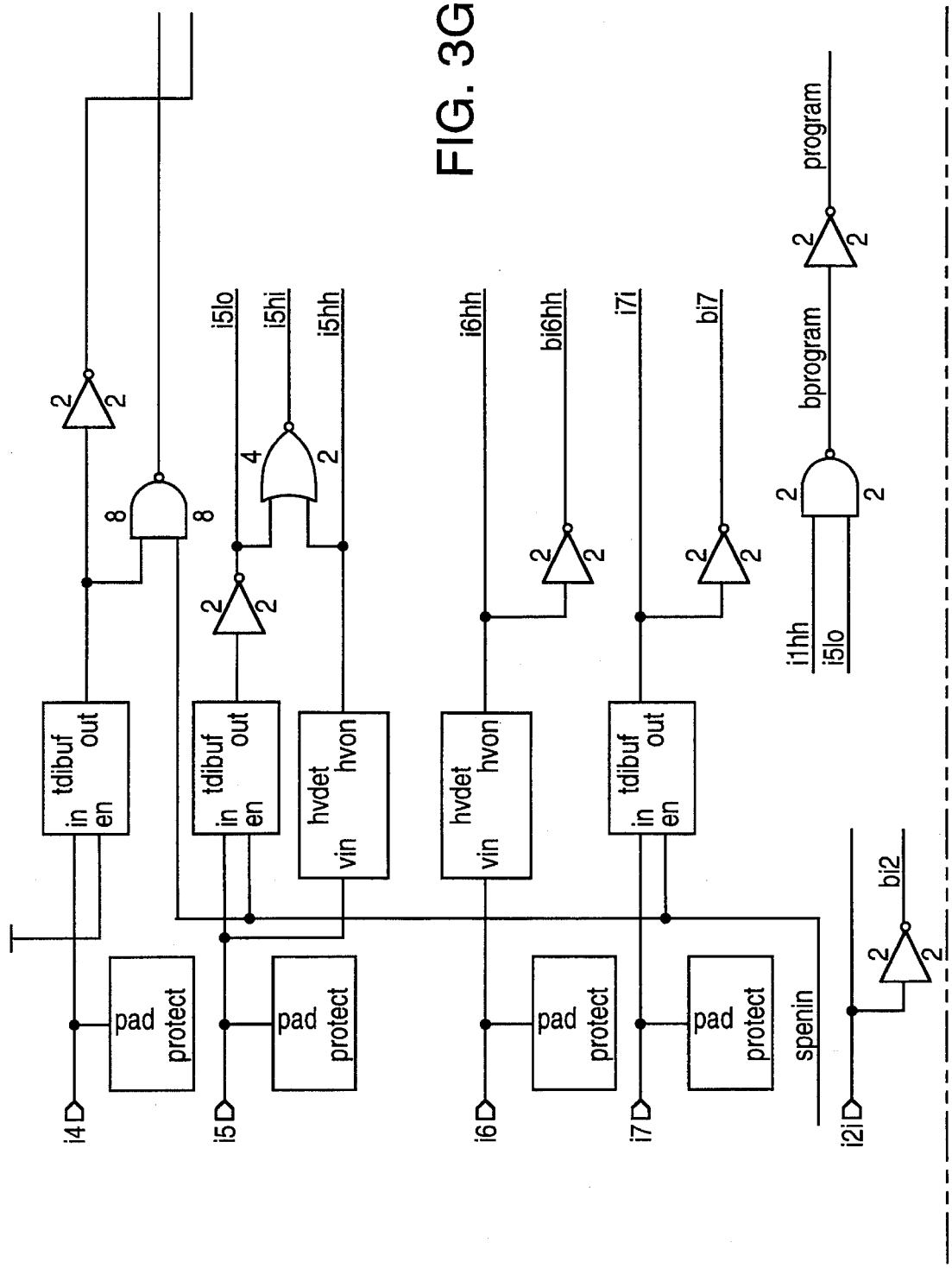
FIG. 3G(1)-1

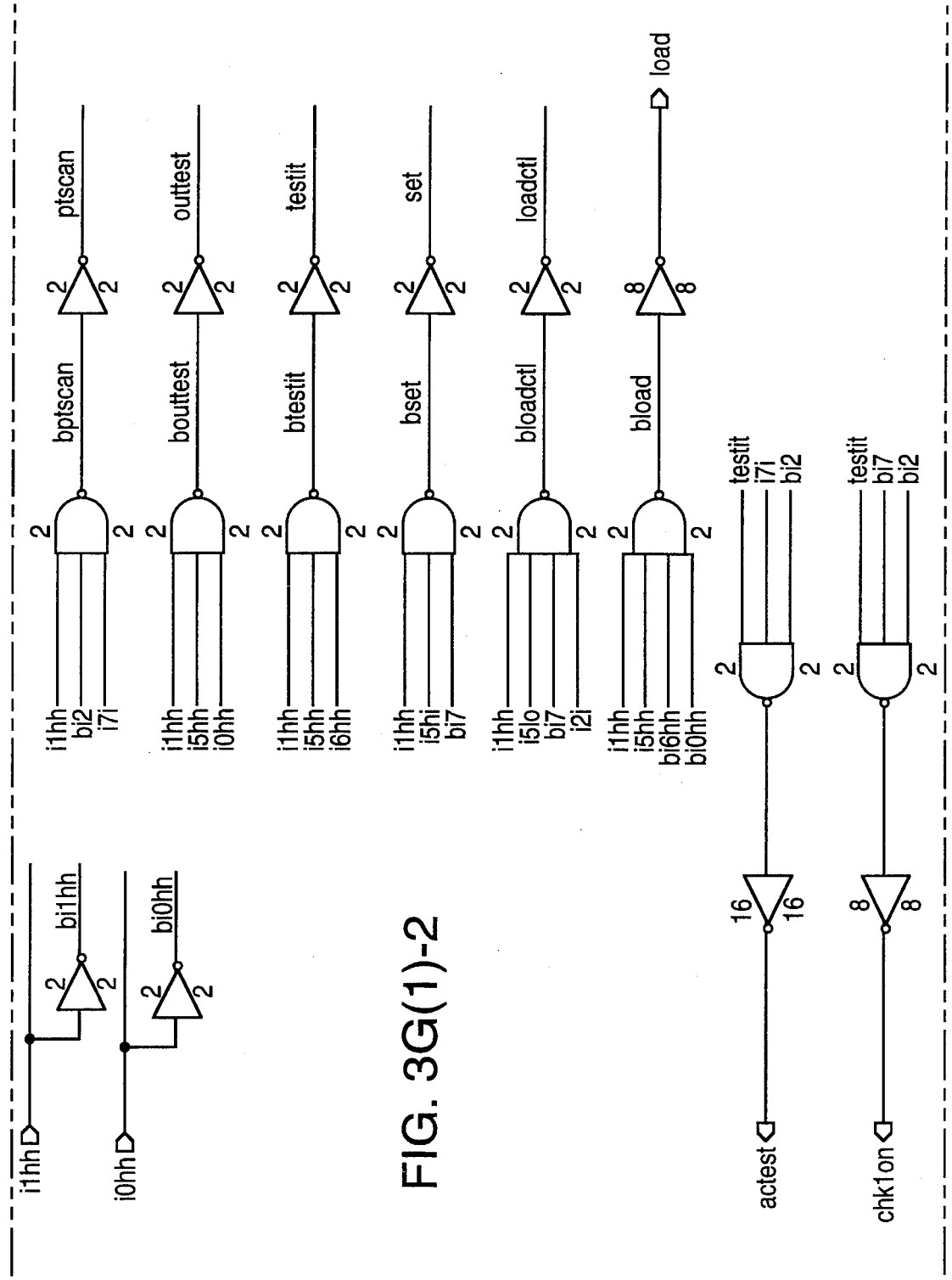
FIG. 3G(1)-2

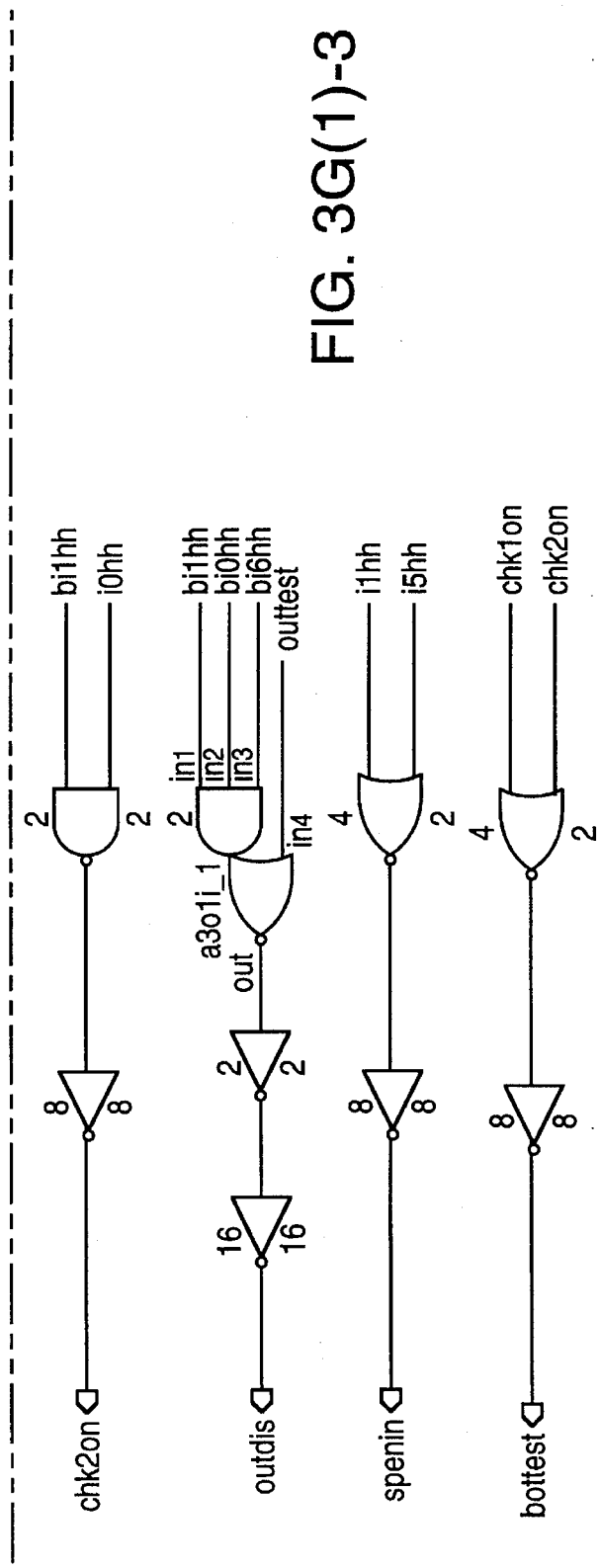
FIG. 3G(1)-3

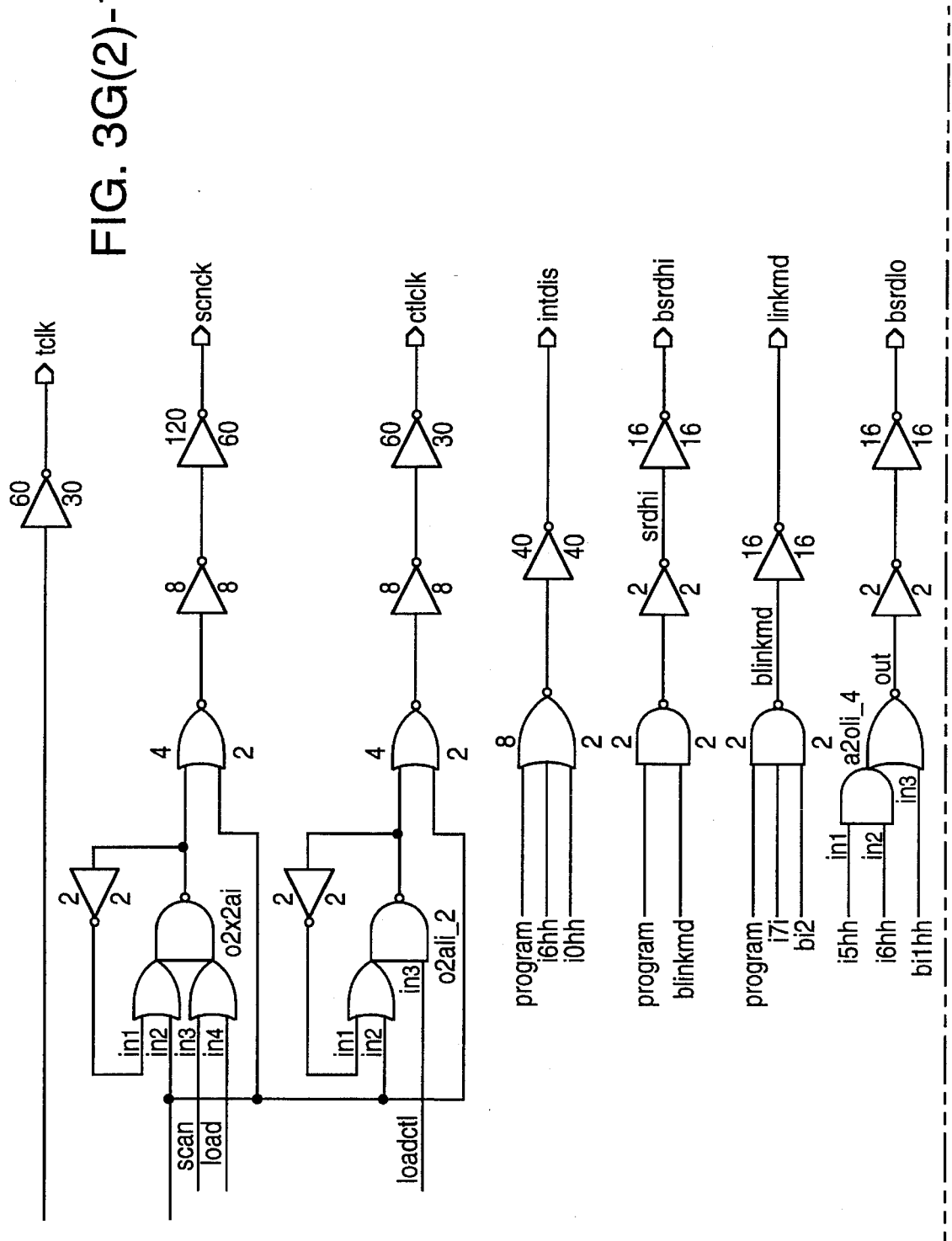
FIG. 3G(2)-1

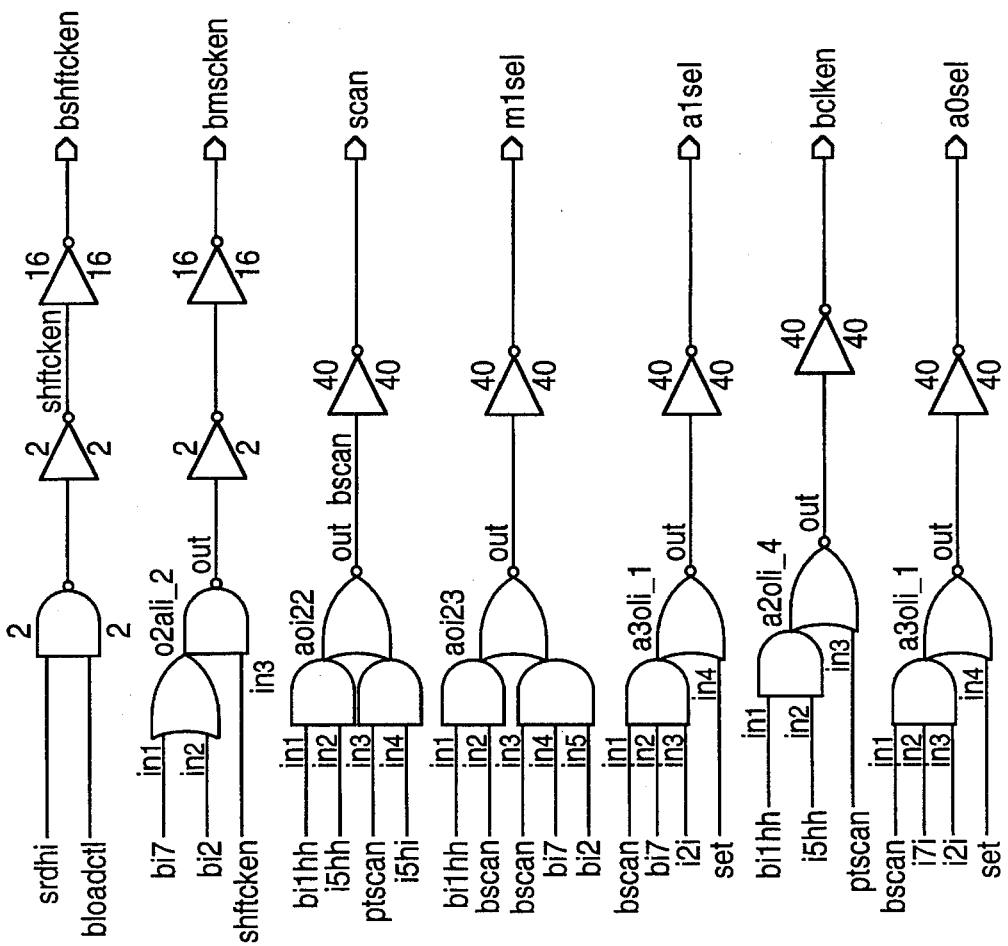
FIG. 3G(2)-2

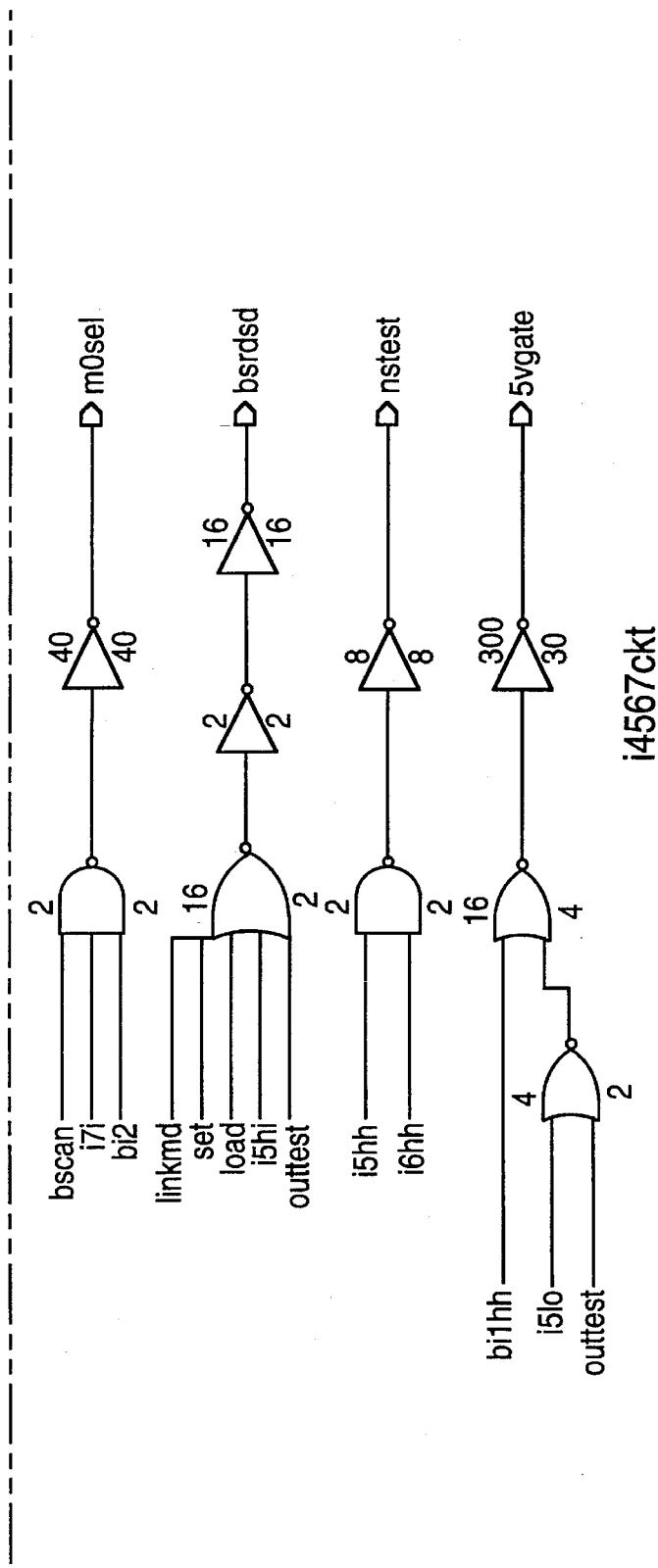
FIG. 3G(2)-3

INTEGRATED CIRCUIT FACILITATING SIMULTANEOUS PROGRAMMING OF MULTIPLE ANTIFUSES

FIELD OF THE INVENTION

This invention relates to programmable logic devices. More particularly, this invention relates to programmable logic devices employing antifuses.

BACKGROUND INFORMATION

FIG. 1 (Prior Art) illustrates a part of a programmable logic device employing a plurality of antifuses. The arrowheads labeled VPP and GND are coupled to the arrowtails labeled VPP and GND, respectively. The reader is referred for background information to: U.S. Pat. No. 5,327,024 entitled "Field Programmable Antifuse Device And Programming Method Therefor" (the contents of which are incorporated herein by reference), U.S. patent application Ser. No. 07/447,969 entitled "Method For Fabrication Of Programmable Interconnect Structure" (the contents of which are incorporated herein by reference), and U.S. patent application Ser. No. 07/892,466 entitled "Programmable Interconnect Structures And Programmable Integrated Circuits" (the contents of which are incorporated herein by reference).

To program pass antifuse 1, a conductive path from programming bus 2 to programming bus 3 is established by turning on programming disable transistor 4, programming pass transistors 5 and 6, and programming disable transistor 7. Programming current transistor 8 is turned on and with programming current transistor 10 off so that programming voltage VPP (for example, 12.5 volts with respect to ground potential) on terminal 9 is conducted through programming current transistor 8, through programming bus 2, through programming disable transistor 4, through programming pass transistor 5 and to one electrode of antifuse 1. Programming current transistor 11 is turned on with programming current transistor 12 off so that ground potential is conducted from GND terminal 13, through programming current transistor 11, through programming bus 3, through programming disable transistor 7, through programming pass transistor 6 and to another electrode of antifuse 1. Because programming pass transistor 14 is nonconductive, a sufficient voltage develops between the two electrodes of antifuse 1 to program antifuse 1 thereby forming a permanent low impedance connection.

Programming current flow is reversed by turning programming current transistor 10 on and programming current transistor 8 off to couple GND terminal 13 to programming bus 2, and by turning programming current transistor 12 on and programming current transistor 11 off to couple VPP terminal 9 to programming bus 3. In this way, programming current is made to flow in the opposite direction through antifuse 1. Pulses of current in different directions are pulsed through antifuse 1 in accordance with the technique set forth in U.S. Pat. No. 5,302,546 entitled "Programming Of Antifuses" (the contents of which are incorporated herein by reference).

In the circuit of FIG. 1, the gates of programming pass transistors 5 and 15 are coupled together, the gates of programming pass transistors 14 and 16 are coupled together, and the gates of programming pass transistors 6 and 17 are coupled together. To prevent antifuse 18 from being erroneously programmed when antifuse 1 is being programmed, programming disable transistors 19 and 20 are controlled to be nonconductive thereby preventing a flow of programming current through antifuse 18.

Because programmable logic devices comprise ever increasing numbers of antifuses as processing technology advances, the time required to program the desired antifuses on a programmable logic device one after another has also increased. It would therefore be desirable to program multiple antifuses simultaneously to reduce the total amount of time required to program all the desired antifuses of a programmable logic device.

If, however, it were attempted to program antifuses 1 and 18 at the same time, problems would likely be encountered. First, if antifuse 1 were to start to program first before antifuse 18, then current would flow through the on-resistances of programming current transistors 8 and 12, thereby reducing the voltage difference between programming buses 2 and 3. As a result, once antifuse 1 begins to program and current begins to flow, there may be an inadequate voltage between programming buses 2 and 3 to initiate programming of antifuse 18.

Second, the programmed conductivity of an antifuse (such as an amorphous silicon antifuse) may depend on the magnitude of current with which the antifuse is programmed. A large amount of programming current may be required to program the antifuse to have a satisfactorily low programmed resistance. Even if both antifuses 1 and 18 were to begin to program, one of antifuses 1 and 18 may be initially more conductive than the other. This would result in the more conductive antifuse conducting more of the programming current and thereby preventing enough programming current from flowing through the other antifuse. As a result, one of the antifuses may not be able to be programmed to an adequately low programmed resistance.

A programmable integrated circuit device architecture is therefore sought which overcomes these problems and facilitates the simultaneous programming of multiple antifuses.

SUMMARY

A first current path is established from a first programming current terminal of a programmable logic device through a first antifuse to be programmed and a second current path is established from a second programming current terminal of the programmable logic device through a second antifuse to be programmed. By supplying the programming current for programming the first antifuse from a different terminal than the programming current for programming the second antifuse, the two antifuses can be programmed simultaneously with an adequate amount of programming current being supplied to each antifuse.

An integrated circuit comprises a first programming current multiplexer circuit and a second programming current multiplexer circuit. The first programming current multiplexer circuit is provided for coupling one of three programming current terminals (VPP2, VPP1, and GND) to a first antifuse to be programmed. The second programming current multiplexer circuit is provided for coupling another of the three programming current terminals to a second antifuse to be programmed. Accordingly, a first programming current terminal (for example, VPP1) can supply programming current to program the first antifuse, whereas a separate programming current terminal (for example, VPP2) can supply programming current to program the second antifuse.

In some embodiments, the programming current multiplexer circuit includes charge pumps for driving the gates of the programming current transistors with high voltages so that the voltage output by the programming current multiplexer circuit will be substantially equal to the voltage on the programming current input terminals. In some embodiments, the programming current multiplexer circuit includes a shift register, a decoder, and a plurality of programming current transistors. To couple a selected one of the programming current input terminals through the programming current multiplexer circuit to an antifuse, the shift register is loaded from off-chip with appropriate programming data. The decoder decodes that parallel programming data output from the shift register and outputs control signals to control the gates of the multiplexing programming current transistors so as to couple a desired programming current input terminal to an output lead of the programming current multiplexer circuit. In some embodiments, the programming current multiplexer circuit includes a testing transistor for selectively coupling a VCC terminal of the integrated circuit to the output lead of the programming current multiplexer circuit so that a programming bus coupled to the output lead and the conductors coupled to it can be used to test the integrated circuit before programming. Other structures and methods are disclosed which facilitate the simultaneous programming of multiple antifuses.

BRIEF DESCRIPTION OF THE DRAWINGS

FIGS. 3A–3H are a schematic diagram in accordance with a specific embodiment of the present invention.

DETAILED DESCRIPTION OF THE PREFERRED EMBODIMENTS

Figure 1:
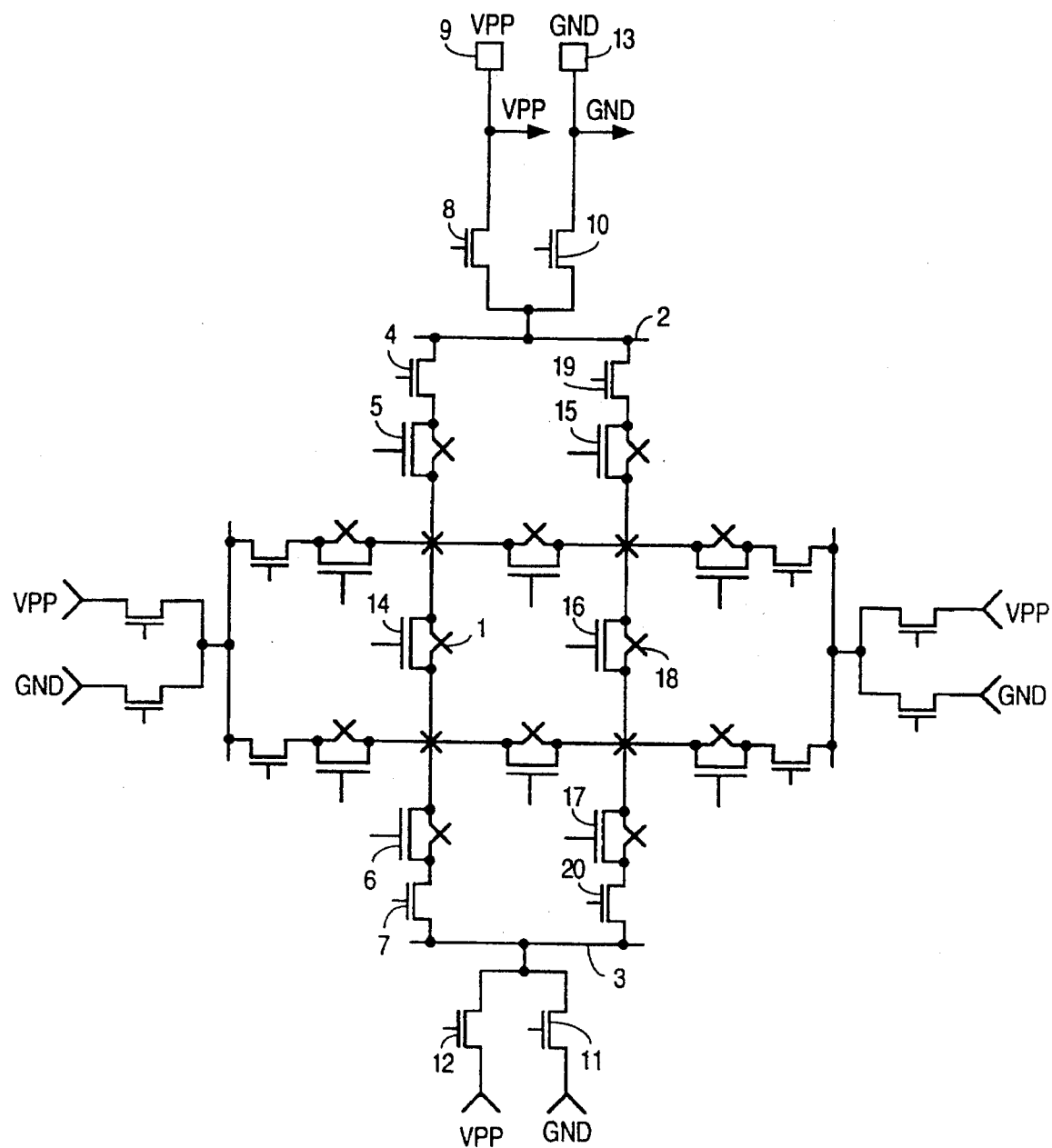
FIG. 1 (Prior Art) is a diagram of programmable logic device.
Figure 2:
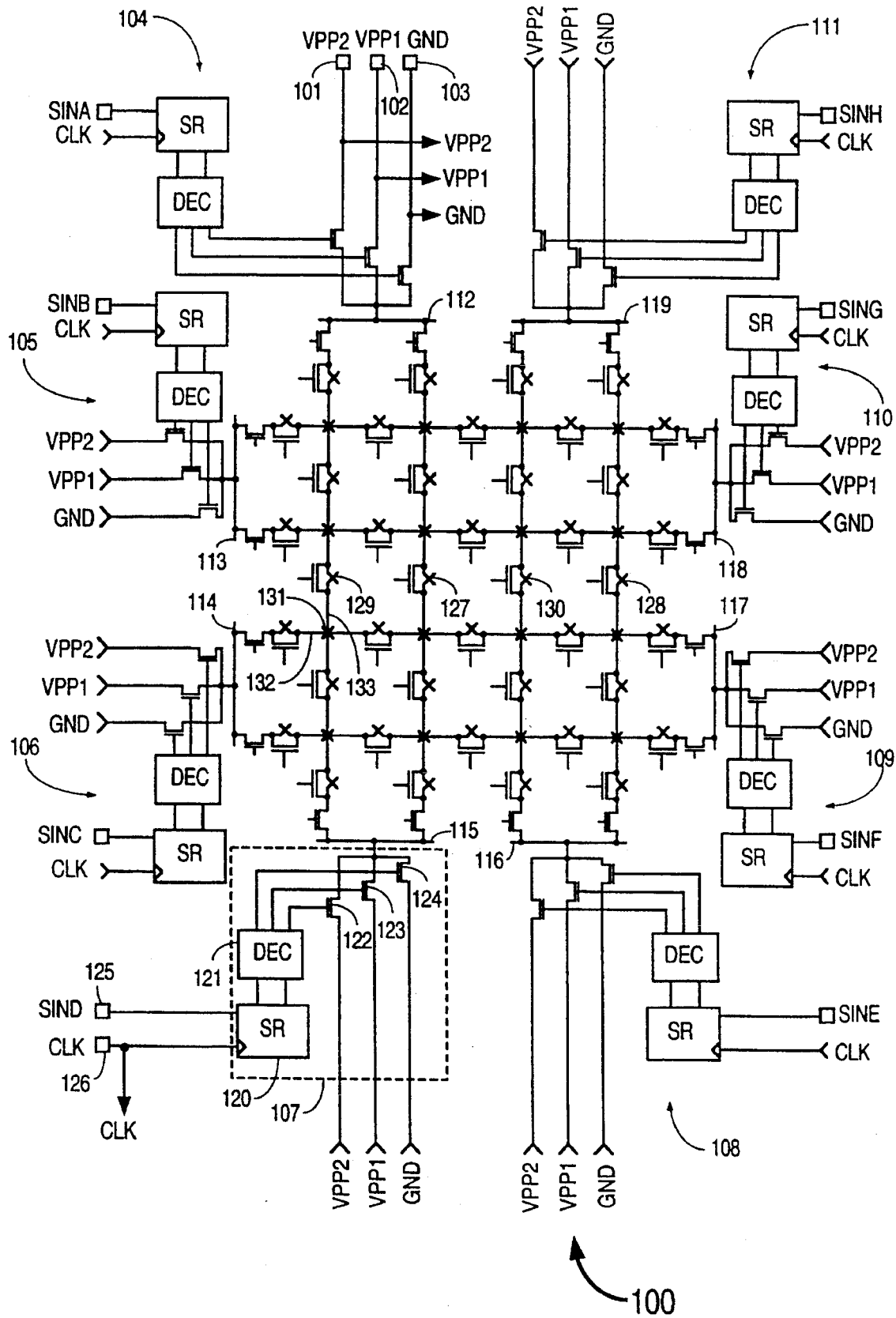
FIG. 2 is a diagram of a programmable logic device (a field programmable gate array) in accordance with an embodiment of the present invention.

FIG. 2 is a simplified top-down diagram of an integrated circuit 100 in accordance with the present invention. Integrated circuit 100 comprises three programming current terminals 101–103, eight programming current multiplexer circuits 104–111, eight programming buses 112–119, four strings of antifuses and conductors extending in a horizontal direction, as well as four strings of antifuses and conductors extending in a vertical dimension.

Each programming current multiplexer circuit of FIG. 2 includes a shift register, a decoder, and a plurality of programming current transistors. Programming current multiplexer circuit 107 is illustrative of each of the programming current multiplexer circuits. Programming current multiplexer circuit 107 comprises a two-bit shift register 120, a two-to-three decoder 121, and three programming current field effect transistors 122–124. The serial data input lead of shift register 120 is coupled to an input terminal 125 of the integrated circuit 100 and the clock input lead of shift register 120 is coupled to an input terminal 126 of the integrated circuit 100. Accordingly, data indicating which of the terminals 101, 102 and 103 is to be coupled via the programming current multiplexer circuit 107 to programming bus 115 is clocked into shift register 120 using terminals 125 and 126. Depending on the data in shift register 120, one of programming current transistors 122–124 is turned on and the others are turned off.

An operation of the specific embodiment of FIG. 2 is explained in connection with an example of the simultaneous programming of antifuses 127 and 128. The shift registers of programming current multiplexer circuits 104 and 111 are loaded such that GND terminal 103 is coupled to programming buses 112 and 119. The shift register of programming current multiplexer circuit 107 is loaded such that VPP2 terminal 101 is coupled to programming bus 115 and the shift register of programming current multiplexer circuit 108 is loaded such that VPP1 terminal 102 is coupled to programming bus 116.

With the programming current multiplexer circuits so loaded, and with the appropriate programming pass transistors and the programming disable transistors of the strings including antifuses 127 and 128 turned on, the programming current for programming antifuse 127 is supplied from VPP2 terminal 101 and the programming current for programming antifuse 128 is supplied from VPP1 terminal 102. Antifuses 129 and 130 are not programmed because the programming disable transistors of the strings of those antifuses are controlled to be nonconductive. Accordingly, an adequately high voltage can be placed across both antifuses 127 and 128 to initiate programming of both antifuses and an adequate amount of programming current is made to flow through each of the two antifuses once programming is initiated. The direction of the flow of programming current is reversed by coupling programming buses 115 and 116 to the GND terminal 103 and by coupling programming buses 112 and 119 to the VPP2 and VPP1 terminals, respectively.

Although the programming current terminals are shown directly connected to the respective programming current field effect transistors in FIG. 2, an additional isolation transistor is provided in some embodiments. Programming current terminal VPP2, for example, is shown in FIG. 2 to be directly connected to eight programming current field effect transistors, one in each of the eight programming current multiplexer circuits 104–111. In the event that terminal VPP2 is used for other purposes during normal circuit operation, the eight programming current field effect transistors may place an undesirably large amount of capacitance on terminal VPP2. In the physical layout, the programming current field effect transistors must also be protected from electrostatic discharge and nearby transistors must be protected from latchup. Accordingly, an isolation field effect transistor (not shown) is placed in the programming current path from the programming current terminal 101 to the multiple programming current field effect transistors of the programming current multiplexer circuits. This isolation transistor simplifies the physical layout and is turned off during normal circuit operation, thereby reducing the capacitance on the terminal during normal circuit operation. Each programming current terminal may be coupled to a respective one of such isolation field effect transistors.

In FIG. 2, the gates of the corresponding pass transistors of each of the vertical strings of antifuses, conductors and pass transistors are coupled together. For example, the pass transistors associated with antifuses 127–130 are all coupled together. In some embodiments, however, these pass transistors are controlled in groups. On one embodiment, for example, the gates of the pass transistors of antifuses 127 and 129 are coupled to a first programming control conductor (not shown) whereas the gates of the pass transistors of antifuses 128 and 130 are coupled to a second programming control conductor (not shown). Providing different programming control conductors increases the likelihood that multiple antifuses of a user-specific design can be programmed simultaneously.

The antifuses of FIG. 2 may be programmed using techniques set forth in U.S. patent application Ser. No.

08/349,092 entitled "Method For Simultaneous Programming Of Multiple Antifuses", by Mukesh T. Lulla filed Dec. 1, 1994 (the contents of which are incorporated herein by reference).

Figure 3A:
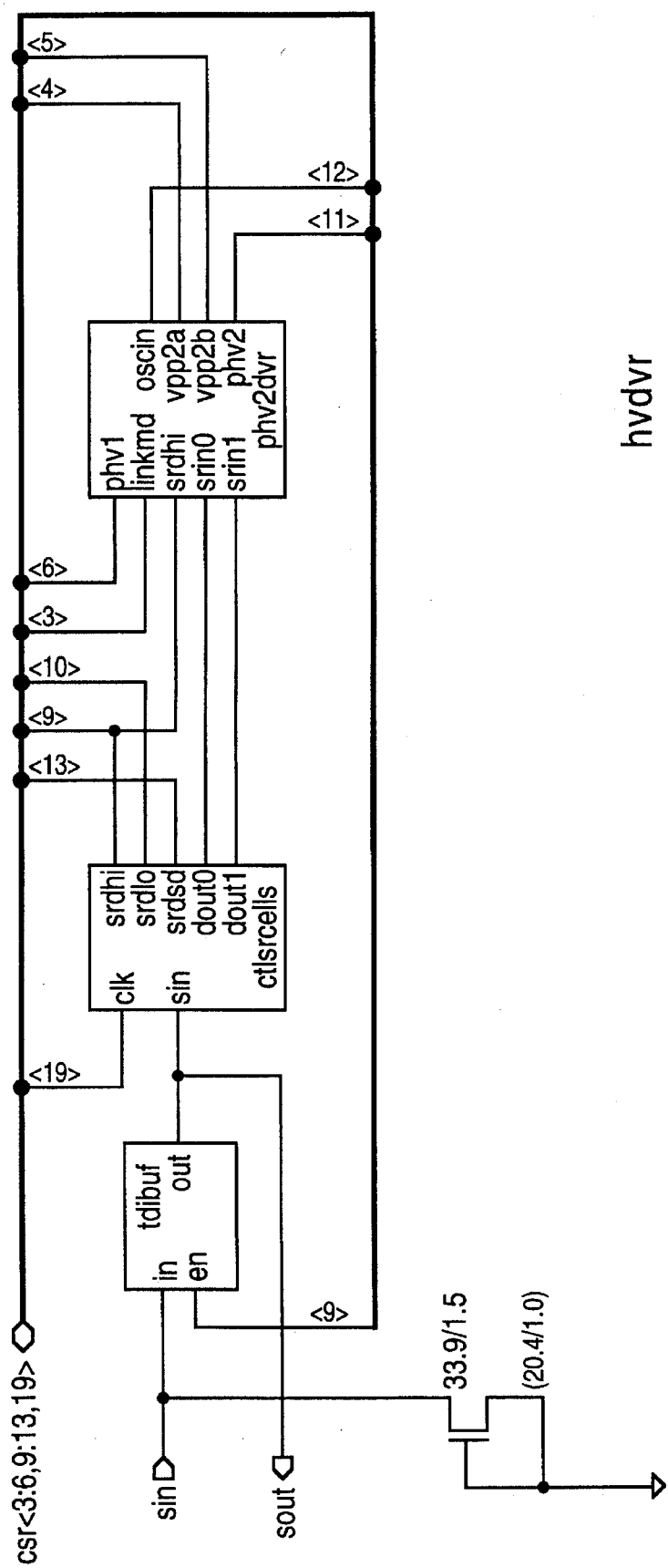
Figure 3B:
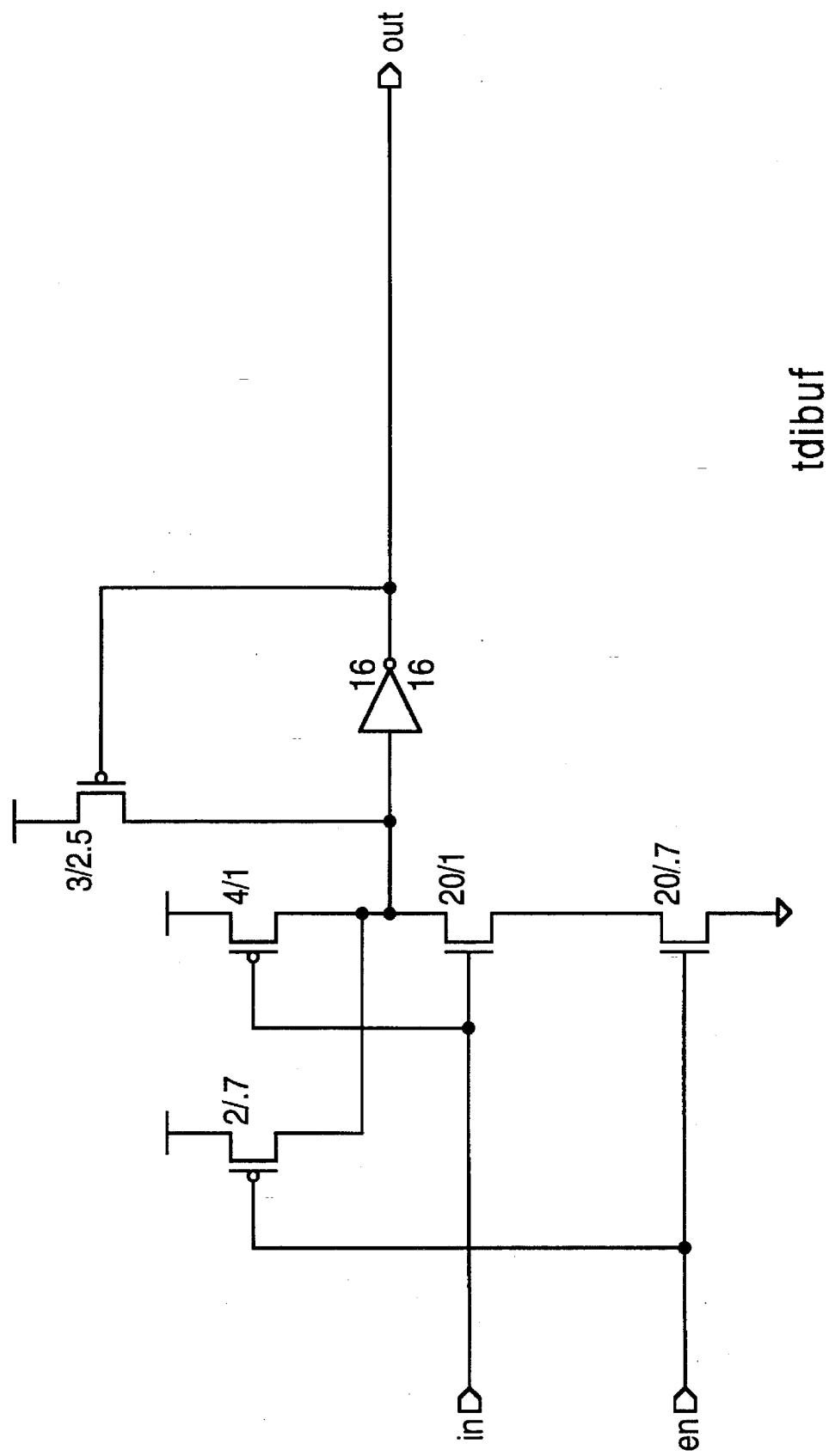
Figure 3C:
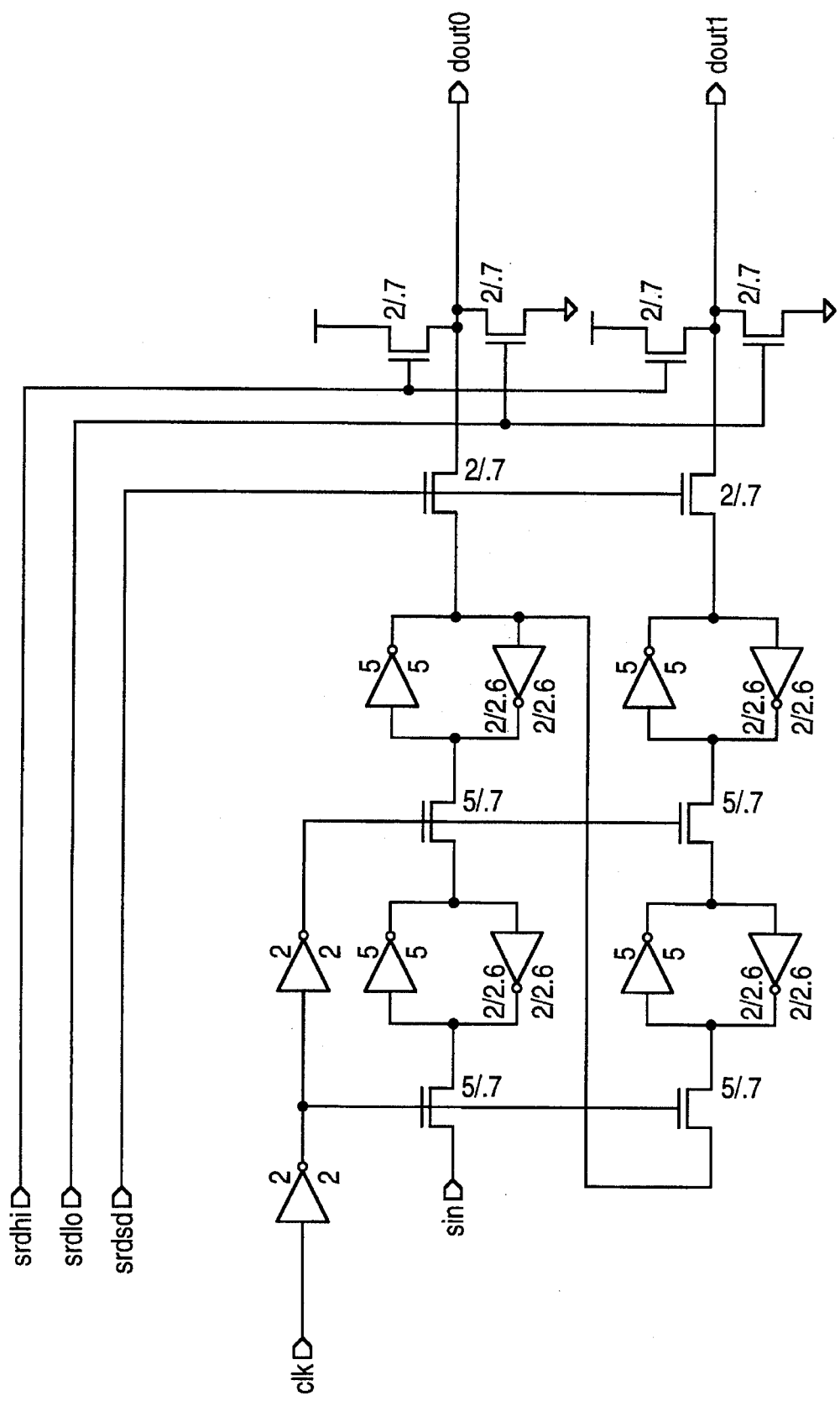
Figures 1, 3D:
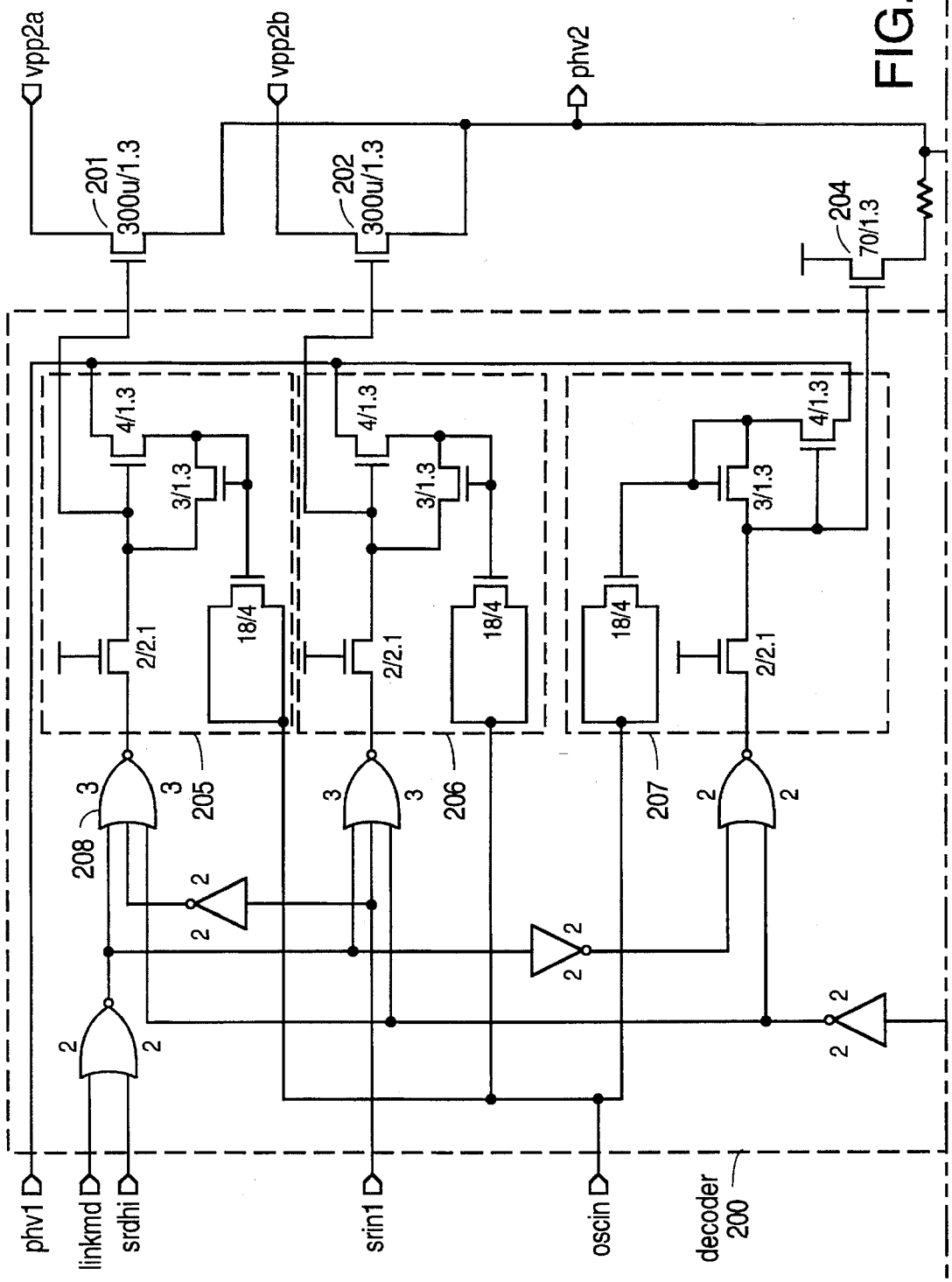
Figures 2, 3D:
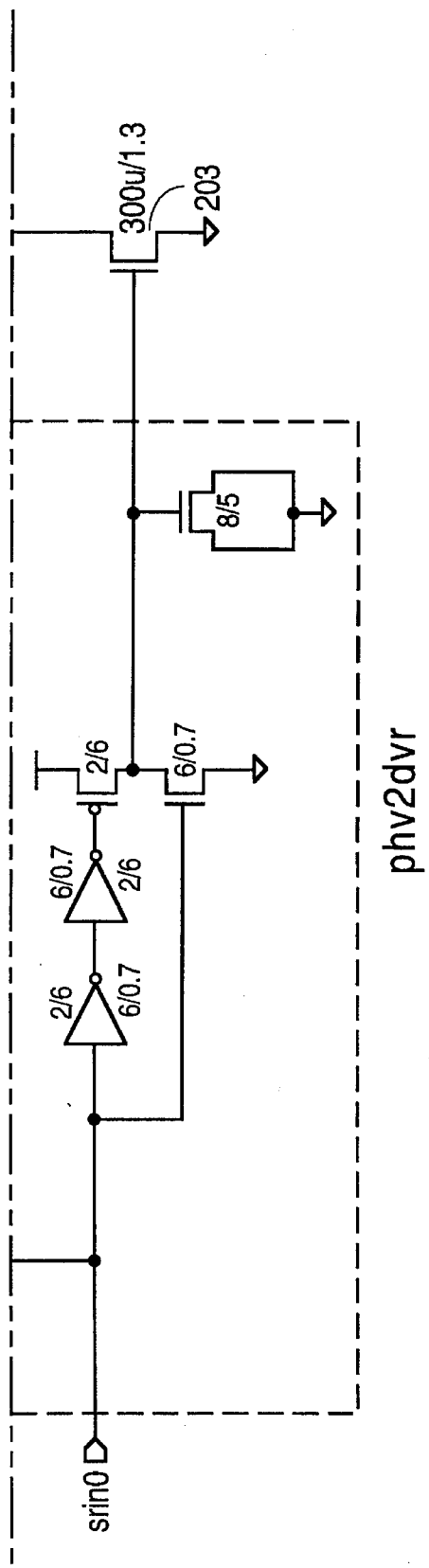
Figures 1, 3E:
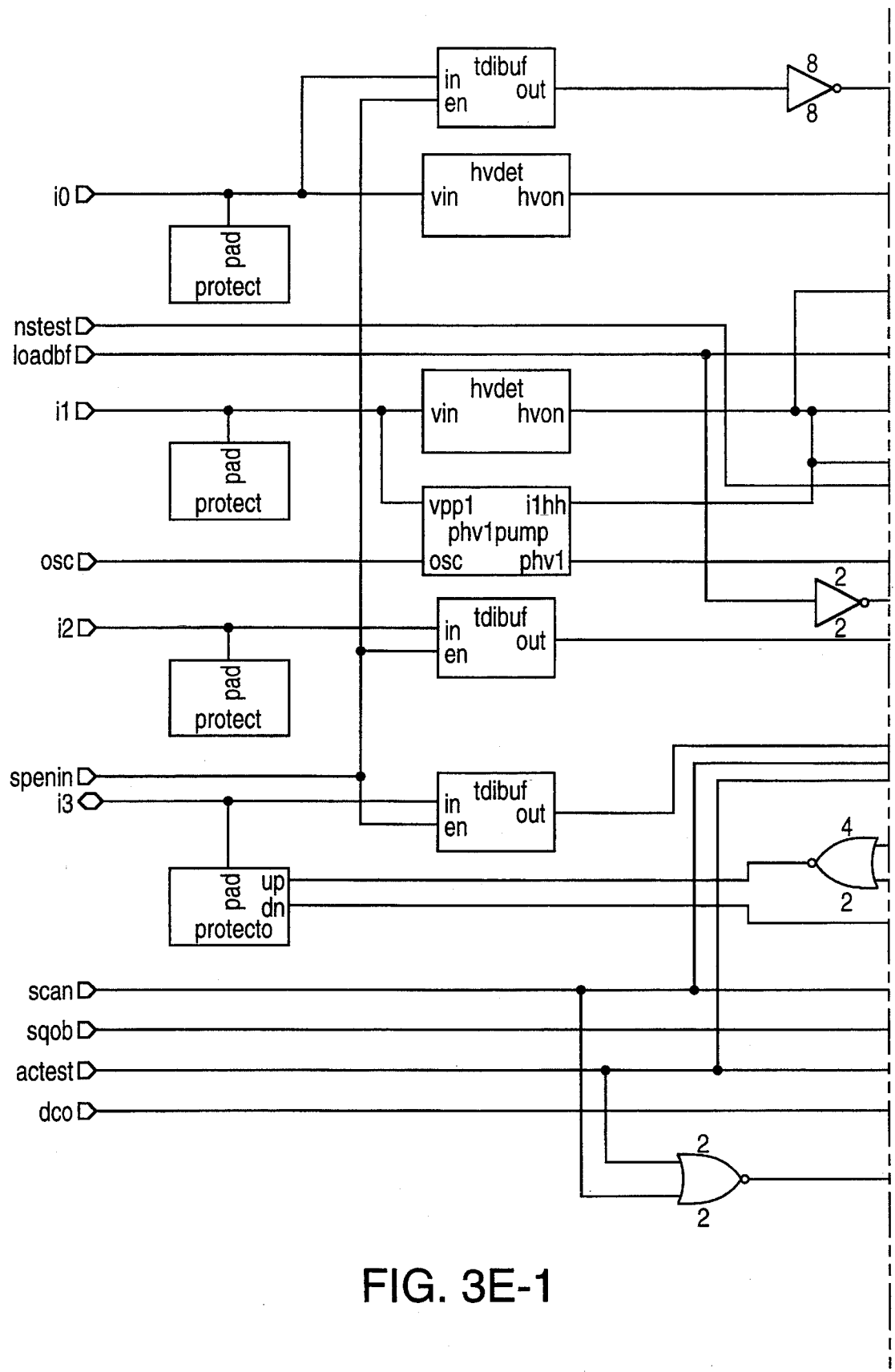
Figure 3H:
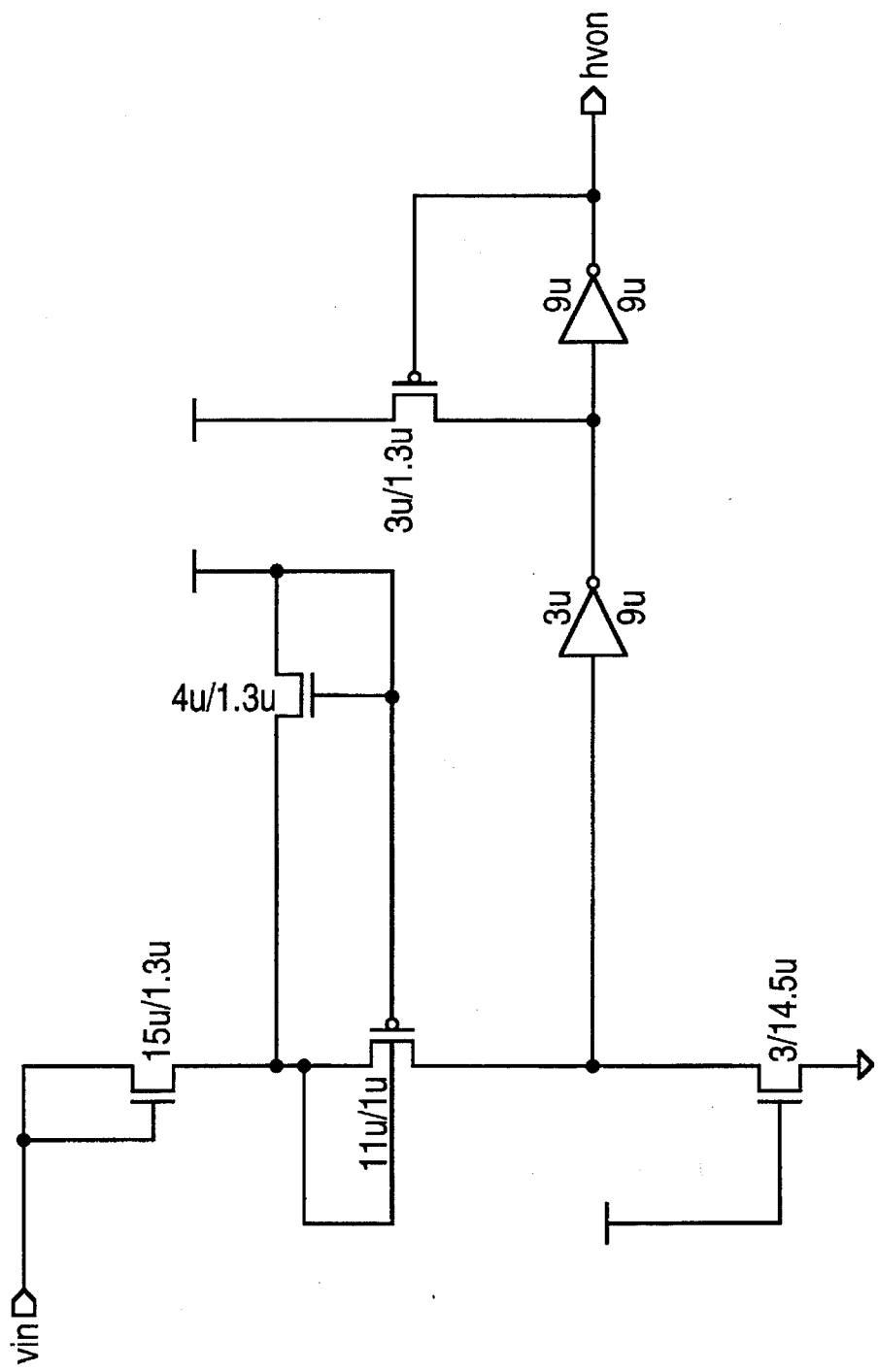

FIGS. 3A–3H are a schematic diagram in accordance with a specific embodiment of the present invention. The leads labeled sin and sout in FIG. 3A are coupled to programming data terminals of the integrated circuit. FIG. 3C is a schematic of a two-bit shift register corresponding with shift register 120 of FIG. 2. FIG. 3D is a schematic of a two-to-four decoder 200, three programming current transistors 201–203, and a testing transistor 204. Two-to-four decoder 200 of FIG. 3D corresponds with decoder 121 of FIG. 2. Programming current transistors 201, 202 and 203 of FIG. 3D correspond with programming current transistors 122, 123 and 124 of FIG. 2. Leads srin0 and srin1 of FIG. 3D are coupled to the two output leads dout0 and dout1 of the two-bit shift register of FIG. 3C as indicated in FIG. 3A.

The programming current multiplexer circuit of FIGS. 3A–3H is a four-to-one multiplexer rather than a three-to-one multiplexer, as shown in the simplified diagram of FIG. 2. The testing transistor 204 of FIG. 3D is provided so that a digital logic high can be placed onto the programming bus and the associated routing wires during testing before antifuse programming.

The programming current multiplexer circuit of FIGS. 3A–3H also includes three charge pump circuits 205–207. Charge pump circuit 205, for example, increases the magnitude of the digital high signal value on the gate of programming current transistor 201 to approximately VPP+ $V_t$ (where $V_t$ is the threshold voltage of transistor 201 and VPP is the voltage on phv1) so that the voltage supplied by transistor 201 onto output lead phv2 from input lead vpp2a will be approximately equal to the voltage on the lead vpp2a rather than the voltage on lead vpp2a minus the threshold voltage $V_t$. The lead oscin supplies a clock signal from an on-chip ring oscillator for use by the charge pump circuits. Transistor 205a protects the N-channel and P-channel transistors of NOR gate 208 by limiting the magnitude of the voltage passed from the charge pump back to the output lead of NOR gate 208 to VCC–$V_t$. The lead linkmd is provided so that a digital high placed on this lead during antifuse programming will prevent VCC programming current transistor 204 from being conductive, and will enable the charge pumps 205 and 206 to be controlled by srin0 and srin1. The lead srdhi is provided so that a digital high placed on this lead will enable the charge pump 205 and programming current transistor 201 to be used for precharging.

Although specific embodiments of the present invention have been described for instructional purposes in order to illustrate the present invention, the present invention is not limited thereto. The antifuses of various interconnect and antifuse architectures can be programmed in accordance with the present invention. In some embodiments, programming pass transistors are not used. See, for example, the architecture set forth in U.S. patent application Ser. No. 08/246,527 entitled "Programmable Application Specific Integrated Circuit Having Antifuses And Methods Therefor" (the contents of which are incorporated herein by reference). The invention is not limited to the use of strings of conductors and antifuses. Nor is the invention limited to the use of the programming disable transistors illustrated in connection with the specific embodiments. A shift register and associated decoder is but one suitable means for controlling the programming current transistors. Other means may be employed to selectively control the programming current transistors. The programming current transistors may, for example, be either bipolar or field effect transistors. Any suitable antifuse structure can be programmed in accordance with the present invention including, but not limited to, amorphous silicon antifuses and oxide-nitride-oxide antifuses. In one embodiment voltages VPP2, VPP1, VCC and GND are approximately 12.5, 12.5, 5 and 0 volts, respectively, but other suitable voltages can be employed. In some embodiments, more than two VPP programming current terminals are provided and more than two antifuses are programmed simultaneously. The programming current terminals may be dedicated to supplying programming current or may also have other uses during normal circuit operation.

Accordingly, various adaptations, modifications and substitutions of various of the features of the specific embodiments described herein can be practiced without departing from the scope of the invention as defined by the appended claims.

What is claimed is:

1. An integrated circuit, comprising:

an antifuse;

a first programming current terminal;

a second programming current terminal;

a third programming current terminal;

a programming current multiplexer circuit having a first input lead coupled to said first programming current terminal, a second input lead coupled to said second programming current terminal, a third input lead coupled to said third programming current terminal, and an output lead; and an electrical connection coupling said antifuse to said output lead of said programming current multiplexer circuit.

2. The integrated circuit of claim 1, wherein said first programming current terminal is a programming voltage terminal for coupling said integrated circuit to a first programming voltage, wherein said second programming current terminal is a programming voltage terminal for coupling said integrated circuit to a second programming voltage, and wherein said third programming current terminal is a ground terminal for coupling said integrated circuit to ground potential.

3. The integrated circuit of claim 2, wherein said first programing voltage is the same as said second programming voltage.

4. The integrated circuit of claim 1, wherein said electrical connection comprises no programming pass transistors.

5. The integrated circuit of claim 1, wherein said electrical connection comprises a programming disable transistor.

6. The integrated circuit of claim 1, further comprising:

a second programming current multiplexer circuit having a first input lead coupled to said first programming current terminal, a second input lead coupled to said second programming current terminal, a third input lead coupled to said third programming current terminal, and an output lead; and a second electrical connection coupling said antifuse to said output lead of said second programming current multiplexer circuit.

7. The integrated circuit of claim 1, wherein said programming current multiplexer circuit comprises a shift register, data bits in said shift register controlling which of said first, second and third input leads is coupled to said output lead.

8. The integrated circuit of claim 7, wherein said integrated circuit further comprises:

a serial programming data input terminal, said programming current multiplexer circuit having a serial programming data input lead coupled to said serial programming data input terminal.

9. The integrated circuit of claim 7, said programming current multiplexer circuit further comprising:

a first programming current field effect transistor having a control electrode;

a second programming current field effect transistor having a control electrode;

a third programming current field effect transistor having a control electrode; and a decoder having input leads and output leads, said input leads of said decoder being coupled to output leads of said shift register, each respective one of said output leads of said decoder being coupled to a corresponding one of the control electrodes of said first, second and third programming current field effect transistors.

10. The integrated circuit of claim 1, further comprising:

a VCC terminal, wherein said programming current multiplexer circuit has a fourth input lead coupled to said VCC terminal.

11. The integrated circuit of claim 1, wherein said programming current multiplexer circuit comprises:

a first field effect transistor having a first electrode coupled to said first input lead of said programming current multiplexer circuit, a second electrode coupled to said output lead of said programming current multiplexer circuit, and a control electrode;

a first charge pump circuit coupled to said control electrode of said first field effect transistor;

a second field effect transistor having a first electrode coupled to said second input lead of said programming current multiplexer circuit, a second electrode coupled to said output lead of said programming current multiplexer circuit, and a control electrode; and a second charge pump circuit coupled to said control electrode of said second field effect transistor.

12. The integrated circuit of claim 1, wherein said programming current multiplexer circuit further comprises:

means for coupling said output lead of said programming current multiplexer circuit to a voltage VCC prior to antifuse programming.

13. The integrated circuit of claim 1, wherein said first input lead is coupled to said first programming current terminal via a first isolation transistor, wherein said second input lead is coupled to said second programming current terminal via a second isolation transistor, and wherein said third input lead is coupled to said third programming current terminal via a third isolation transistor.

14. The integrated circuit of claim 1, wherein said electrical connection comprises a programming pass transistor through which a programming current can flow.

15. An integrated circuit, comprising:

a first programming current terminal;

a second programming current terminal;

a third programming current terminal;

a first programming bus;

a second programming bus;

a third programming bus;

a fourth programming bus;

a first programming current multiplexer circuit having a first input lead coupled to said first programming current terminal, a second input lead coupled to said second programming current terminal, a third input lead coupled to said third programming current terminal, and an output lead coupled to said first programming bus;

a second programming current multiplexer circuit having a first input lead coupled to said first programming current terminal, a second input lead coupled to said second programming current terminal, a third input lead coupled to said third programming current terminal, and an output lead coupled to said second programming bus;

a third programming current multiplexer circuit having a first input lead coupled to said first programming current terminal, a second input lead coupled to said second programming current terminal, a third input lead coupled to said third programming current terminal, and an output lead coupled to said third programming bus;

a fourth programming current multiplexer circuit having a first input lead coupled to said first programming current terminal, a second input lead coupled to said second programming current terminal, a third input lead coupled to said third programming current terminal, and an output lead coupled to said fourth programming bus;

a first antifuse programmable by current flowing from said first to said second programming bus; and a second antifuse programmable by current flowing from said third to said fourth programming bus.

16. The integrated circuit of claim 15, wherein said first programming bus is roughly collinear with said third programming bus, said first and third programming buses being metal conductors, and wherein said second programming bus is roughly collinear with said fourth programming bus, said second and fourth programming buses being metal conductors.

17. The integrated circuit of claim 16, wherein said first programming bus is substantially parallel with said second programming bus, and wherein said third programming bus is substantially parallel with said fourth programming bus.

18. The integrated circuit of claim 15, wherein said first programming bus is substantially perpendicular with said second programming bus, and wherein said third programming bus is substantially parallel with the fourth programming bus.

19. The integrated circuit of claim 15, wherein said first programming bus is substantially perpendicular with said second programming bus, and wherein said third programming bus is substantially perpendicular with said fourth programming bus.

20. An integrated circuit, comprising:

a first antifuse;

a second antifuse;

a first programming current terminal;

a second programming current terminal; and means for simultaneously programming said first antifuse with a first programming current and said second antifuse with a second programming current, said first programming current flowing through said first programming current terminal and not through said second programming current terminal, said second programming current flowing through said second programming current terminal and not through said first programming current terminal.

21. The integrated circuit of claim 20 wherein both said first programming current and said second programming current flow through a third programming current terminal of said integrated circuit.

22. A method of substantially simultaneously programming a first antifuse and a second antifuse of an integrated circuit, comprising:

establishing a first current path from a first programming current terminal of said integrated circuit and through said first antifuse; and establishing a second current path from a second programming current terminal of said integrated circuit and through said second antifuse, a first programming current flowing in said first current path but not flowing in said second current path, a second programming current flowing in said second current path but not flowing in said first current path, said first and second programming currents flowing substantially simultaneously.

* * * * *